US012652980B2

(12) United States Patent
   Zhu et al.

(10) Patent No.:  US 12,652,980 B2
(45) Date of Patent:      Jun. 9, 2026

(54) SILICON NITRIDE DAMAGE-FREE DRY ETCH METHOD FOR TUNGSTEN REMOVAL IN MIDDLE OF LINE BOTTOM-UP TUNGSTEN INTEGRATION

(71) Applicant: Applied Materials, Inc., Santa Clara, CA (US)

(72) Inventors: Qihao Zhu, Sunnyvale, CA (US); Chi Hong Ching, Santa Clara, CA (US); Liqi Wu, San Jose, CA (US); Tsungjui Liu, San Jose, CA (US); Gaurav Thareja, Santa Clara, CA (US); Xinke Wang, Singapore (SG); Feng Q. Liu, San Jose, CA (US); Xi Cen, San Jose, CA (US); Kai Wu, Palo Alto, CA (US); Yixiong Yang, San Jose, CA (US); Yuanhung Liu, San Jose, CA (US); Jiang Lu, Milpitas, CA (US); Rongjun Wang, Dublin, CA (US); Xianmin Tang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 458 days.

(21) Appl. No.: 18/142,940

(22) Filed: May 3, 2023

(65) Prior Publication Data

US 2024/0371654 A1      Nov. 7, 2024

(51) Int. Cl.
   *H10P 50/26*        (2026.01)
   *H10P 70/00*        (2026.01)
   *H10W 20/00*        (2026.01)
(52) U.S. Cl.
   CPC ............ *H10P 50/267* (2026.01); *H10P 70/27* (2026.01); *H10W 20/033* (2026.01); *H10W 20/056* (2026.01)

(58) Field of Classification Search
   CPC ......... H01L 21/76843; H01L 21/76846; H01L 21/76847; H01L 21/7685; H01L 21/76865;
   (Continued)

(56) References Cited

U.S. PATENT DOCUMENTS 6,764,940 B1 *  7/2004  Rozbicki ........... H01L 21/76865
                                                       438/653
2004/0259374 A1 *  12/2004  Yasuda ............. H01L 21/76802
                                                       438/751
   (Continued)

OTHER PUBLICATIONS

International Search Report and Written Opinion dated Jun. 3, 2024 for Application No. PCT/US2024/015453.
   (Continued)

*Primary Examiner* — Scott B Geyer
(74) *Attorney, Agent, or Firm* — Patterson + Sheridan, LLP

(57)         ABSTRACT

A method of filling a feature in a semiconductor structure with metal includes depositing a metal cap layer on a bottom surface of a feature formed within a dielectric layer and top surfaces of the dielectric layer, partially filling the feature from the bottom surface with a flowable polymer layer, performing a metal pullback process to remove the metal cap layer on the top surfaces of the dielectric layer selectively to the dielectric layer, wherein the metal pullback process includes a first etch process including a chemical etch process using molybdenum hexafluoride ($MoF_6$) to remove the metal cap layer selectively to the dielectric layer, and a second etch process to remove residues on etched surfaces of the dielectric layer, removing the flowable polymer layer, pre-cleaning a surface of the metal cap layer, and filling the feature from the surface of the metal cap layer with metal fill material.

11 Claims, 7 Drawing Sheets

(58) Field of Classification Search
CPC ....... H01L 21/76871–76876; H01L 21/76877;
H01L 21/02057; H01L 21/0206; H01L
21/02068; H10P 50/267; H10P 70/27;
H10W 20/033; H10W 20/056; H10W
20/037; H10W 20/081
See application file for complete search history.

(56) References Cited

U.S. PATENT DOCUMENTS

| | | | |
|---|---|---|---|
| 2006/0211236 A1* | 9/2006 | Bureau | C23C 18/1893 |
| | | | 438/628 |
| 2017/0200798 A1 | 7/2017 | Chen et al. | |
| 2018/0130707 A1 | 5/2018 | Clendenning et al. | |
| 2019/0164824 A1* | 5/2019 | Wang | H01L 21/32134 |
| 2020/0020578 A1* | 1/2020 | Chang | H01L 21/76831 |
| 2021/0320034 A1 | 10/2021 | Lei et al. | |
| 2021/0343590 A1 | 11/2021 | Chang et al. | |
| 2021/0384035 A1 | 12/2021 | Fisher et al. | |
| 2023/0099053 A1* | 3/2023 | Lin | H01L 21/32139 |
| | | | 438/627 |
| 2024/0047269 A1* | 2/2024 | Na | H01L 21/76843 |

OTHER PUBLICATIONS

U.S. Appl. No. 18/196,833, filed May 12, 2023.
U.S. Appl. No. 17/824,889, filed May 22, 2023.

* cited by examiner

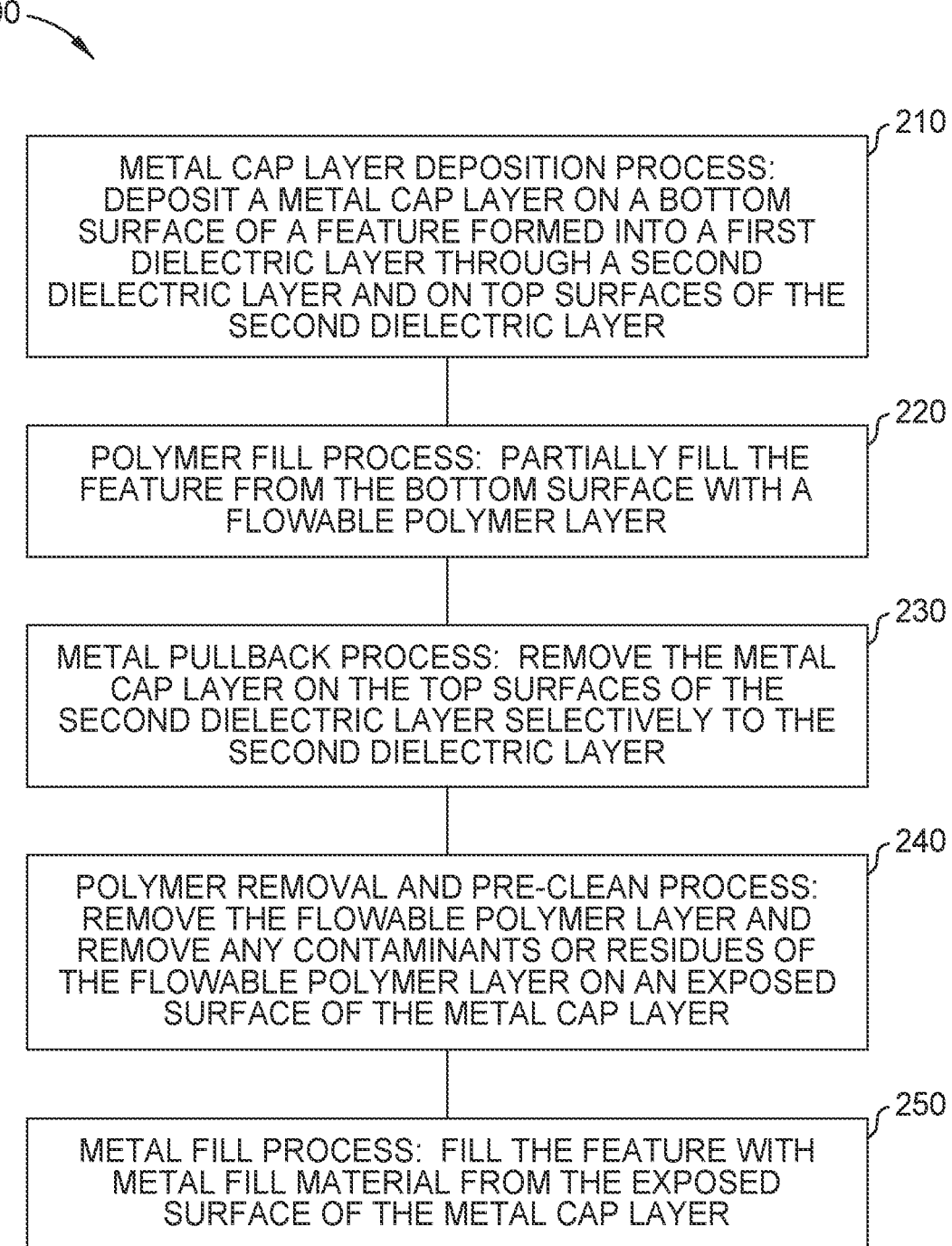

200

METAL CAP LAYER DEPOSITION PROCESS:
DEPOSIT A METAL CAP LAYER ON A BOTTOM
SURFACE OF A FEATURE FORMED INTO A FIRST
DIELECTRIC LAYER THROUGH A SECOND
DIELECTRIC LAYER AND ON TOP SURFACES OF THE
SECOND DIELECTRIC LAYER

210

POLYMER FILL PROCESS:  PARTIALLY FILL THE
FEATURE FROM THE BOTTOM SURFACE WITH A
FLOWABLE POLYMER LAYER

220

METAL PULLBACK PROCESS:  REMOVE THE METAL
CAP LAYER ON THE TOP SURFACES OF THE
SECOND DIELECTRIC LAYER SELECTIVELY TO THE
SECOND DIELECTRIC LAYER

230

POLYMER REMOVAL AND PRE-CLEAN PROCESS:
REMOVE THE FLOWABLE POLYMER LAYER AND
REMOVE ANY CONTAMINANTS OR RESIDUES OF
THE FLOWABLE POLYMER LAYER ON AN EXPOSED
SURFACE OF THE METAL CAP LAYER

240

METAL FILL PROCESS:  FILL THE FEATURE WITH
METAL FILL MATERIAL FROM THE EXPOSED
SURFACE OF THE METAL CAP LAYER

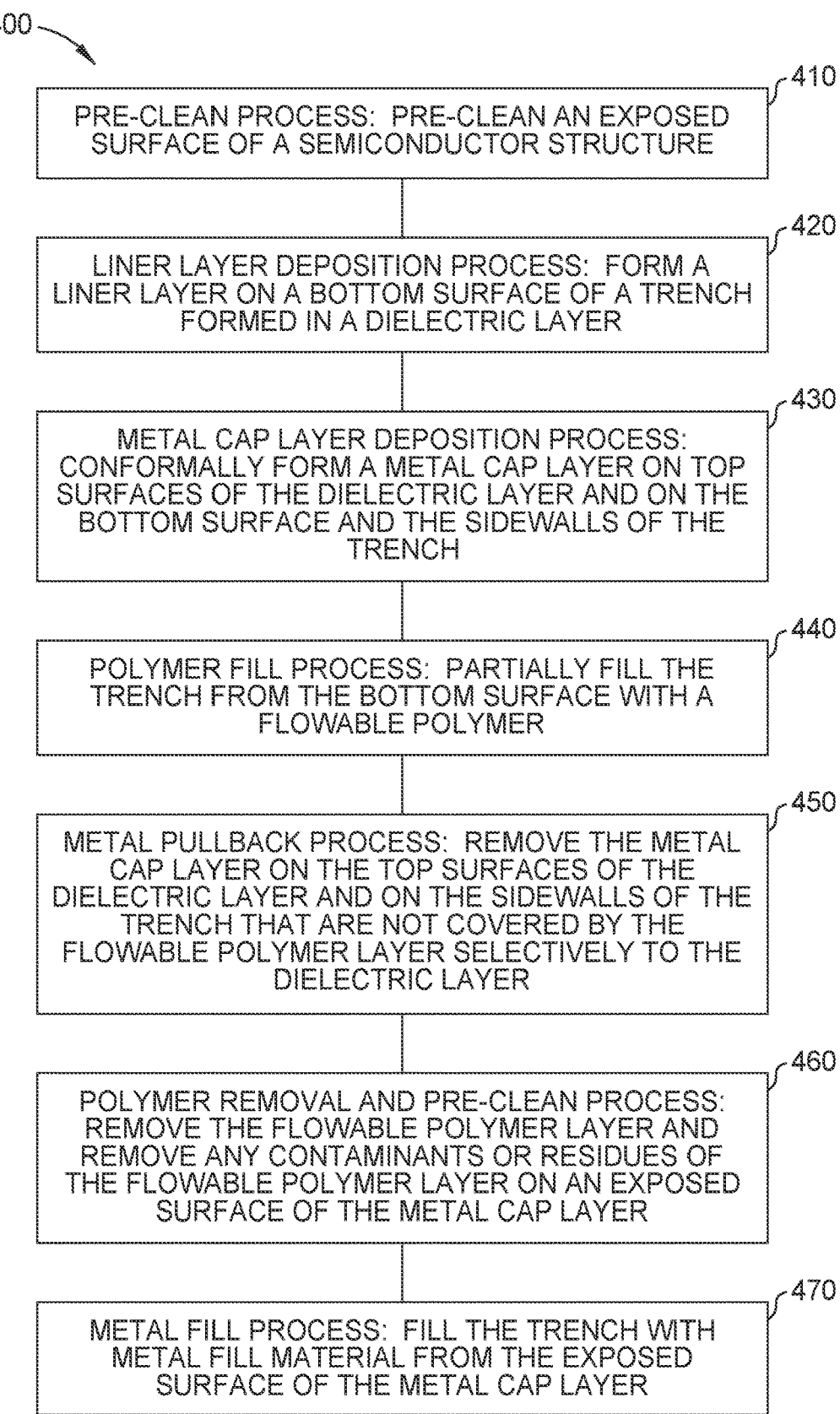

400

410
PRE-CLEAN PROCESS:  PRE-CLEAN AN EXPOSED SURFACE OF A SEMICONDUCTOR STRUCTURE

420
LINER LAYER DEPOSITION PROCESS:  FORM A LINER LAYER ON A BOTTOM SURFACE OF A TRENCH FORMED IN A DIELECTRIC LAYER

430
METAL CAP LAYER DEPOSITION PROCESS: CONFORMALLY FORM A METAL CAP LAYER ON TOP SURFACES OF THE DIELECTRIC LAYER AND ON THE BOTTOM SURFACE AND THE SIDEWALLS OF THE TRENCH

440
POLYMER FILL PROCESS:  PARTIALLY FILL THE TRENCH FROM THE BOTTOM SURFACE WITH A FLOWABLE POLYMER

450
METAL PULLBACK PROCESS:  REMOVE THE METAL CAP LAYER ON THE TOP SURFACES OF THE DIELECTRIC LAYER AND ON THE SIDEWALLS OF THE TRENCH THAT ARE NOT COVERED BY THE FLOWABLE POLYMER LAYER SELECTIVELY TO THE DIELECTRIC LAYER

460
POLYMER REMOVAL AND PRE-CLEAN PROCESS: REMOVE THE FLOWABLE POLYMER LAYER AND REMOVE ANY CONTAMINANTS OR RESIDUES OF THE FLOWABLE POLYMER LAYER ON AN EXPOSED SURFACE OF THE METAL CAP LAYER

470
METAL FILL PROCESS:  FILL THE TRENCH WITH METAL FILL MATERIAL FROM THE EXPOSED SURFACE OF THE METAL CAP LAYER

FIG. 4

SILICON NITRIDE DAMAGE-FREE DRY ETCH METHOD FOR TUNGSTEN REMOVAL IN MIDDLE OF LINE BOTTOM-UP TUNGSTEN INTEGRATION

BACKGROUND

Field

Embodiments of the present disclosure relate, in general, to manufacturing systems and more particularly to selective etch methods for tungsten removal in middle-of-line bottom-up tungsten integration.

Description of the Related Art

Gapfill processes are integral to semiconductor manufacturing processes. In a gap fill process, physical vapor deposition (PVD) or chemical vapor deposition (CVD) grown tungsten (W) capping layers and liners are used to minimize contact resistance in a middle of line (MOL) integration flow. A conventional tungsten capping/liner integration flow includes a PVD or CVD tungsten cap layer deposition, a tungsten pullback (e.g., removal of a tungsten cap layer) by a wet etch, and a CVD selective tungsten fill on the tungsten cap layer or conformal tungsten fill. A conventional tungsten pullback method includes introduction of a high resistive nitridation layer, followed by spin-on coating of bottom anti-reflective coating (BARC), and subsequent steps for a tungsten cap layer removal and BARC removal, totaling of six steps. The use of such high resistive nitridation layers and BARC limits scaling of the MOL structures. Furthermore, a tungsten pullback by a dry etch may damage underlying silicon nitride layers.

Therefore, there is a need in the art for methods for an improved and simplified tungsten pull back method in small critical dimension (CD) structures.

SUMMARY

Embodiments of the present disclosure provide a method of filling a feature in a semiconductor structure with metal. The method includes performing a metal cap layer deposition process to deposit a metal cap layer on a bottom surface of a feature formed within a dielectric layer and top surfaces of the dielectric layer, performing a polymer fill process to partially fill the feature from the bottom surface with a flowable polymer layer, performing a metal pullback process to remove the metal cap layer on the top surfaces of the dielectric layer selectively to the dielectric layer, wherein the metal pullback process includes a first etch process including a chemical etch process using molybdenum hexafluoride ($MoF_6$) to remove the metal cap layer selectively to the dielectric layer, and a second etch process to remove residues on etched surfaces of the dielectric layer from the first etch process, performing a polymer removal and pre-clean process to remove the flowable polymer layer and pre-clean a surface of the metal cap layer, and performing a metal fill process to fill the feature from the surface of the metal cap layer with metal fill material.

Embodiments of the present disclosure provide a method of filling a feature in a semiconductor structure with metal. The method includes performing a metal cap layer deposition process to deposit a metal cap layer on a bottom surface of a feature formed within a dielectric layer and top surfaces of the dielectric layer, performing a polymer fill process to partially fill the feature from the bottom surface with a flowable polymer layer, performing a metal pullback process to remove the metal cap layer on the top surfaces of the dielectric layer selectively to the dielectric layer, wherein the metal pullback process includes a first etch process including a dry etch process using chlorine ($Cl_2$) and nitrogen trifluoride ($NF_3$) plasma, and a second etch process including a dry etch process using chlorine ($Cl_2$) only, performing a polymer removal and pre-clean process to remove the flowable polymer layer and pre-clean a surface of the metal cap layer, and performing a metal fill process to fill the feature from the surface of the metal cap layer with metal fill material.

Embodiments of the present disclosure provide a method of filling a trench in a semiconductor structure with metal. The method includes performing a liner layer deposition process to form a liner layer on a bottom surface of a trench formed within a dielectric layer and top surfaces of the dielectric layer, performing a metal cap layer deposition process to deposit a metal cap layer on the bottom surface and sidewalls of the trench, performing a polymer fill process to partially fill the trench from the bottom surface with a flowable polymer layer, performing a metal pullback process to remove the metal cap layer on the sidewalls of the trench that are not covered by the flowable polymer layer selectively to the dielectric layer, performing a polymer removal and pre-clean process to remove the flowable polymer layer and pre-clean a surface of the metal cap layer, and performing a metal fill process to fill the trench from the surface of the metal cap layer with metal fill material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, as the disclosure may admit to other equally effective embodiments.

FIG. 2 depicts a process flow diagram of a method of forming a semiconductor structure according to one embodiment.

FIG. 4 depicts a process flow diagram of a method of forming a semiconductor structure according to one embodiment.

Figure 1:
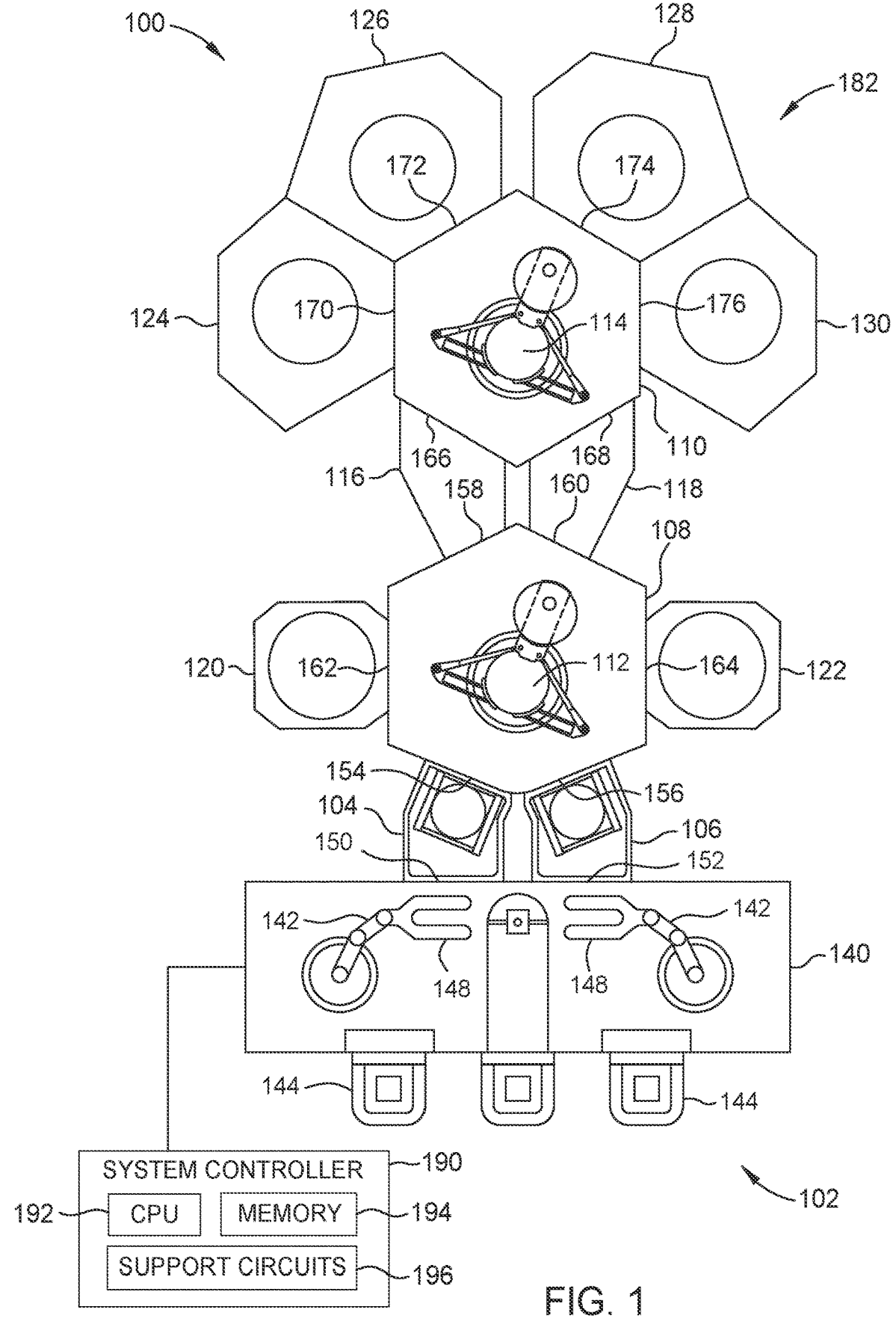
FIG. 1 is a schematic top view of a multi-chamber processing system, according to one or more embodiments of the present disclosure.

To facilitate understanding, identical reference numerals have been used, where possible, to designate identical elements that are common to the figures. It is contemplated that elements and features of one embodiment may be beneficially incorporated in other embodiments without further recitation. In the figures and the following description, an orthogonal coordinate system including an X-axis, a Y-axis, and a Z-axis is used. The directions represented by the arrows in the drawings are assumed to be positive directions for convenience. It is contemplated that elements disclosed in some embodiments may be beneficially utilized on other implementations without specific recitation.

DETAILED DESCRIPTION

The embodiments described herein provide methods for filling a feature having a small critical dimension (CD) with void-free metal, such as tungsten (W). The methods described herein include a deposition of a polymer layer as a protective layer for an underlying tungsten cap layer, a tungsten pullback that selectively removes a tungsten cap layer from a dielectric layer (e.g., silicon nitride ($Si_3N_4$)), and selective metal deposition on the remaining tungsten cap layer. The use of a polymer layer provides capability of metal fill in a feature of a small CD. The tungsten pullback according to the embodiments selectively removes tungsten over a dielectric layer (e.g., silicon nitride ($Si_3N_4$)) without damaging the dielectric layer.

FIG. 1 is a schematic top view of a multi-chamber processing system 100, according to one or more embodiments of the present disclosure. The processing system 100 generally includes a factory interface 102, load lock chambers 104, 106, transfer chambers 108, 110 with respective transfer robots 112, 114, holding chambers 116, 118, and processing chambers 120, 122, 124, 126, 128, 130. As detailed herein, substrates in the processing system 100 can be processed in and transferred between the various chambers without exposing the substrates to an ambient environment exterior to the processing system 100 (e.g., an atmospheric ambient environment such as may be present in a fab). For example, the substrates can be processed in and transferred between the various chambers maintained at a low pressure (e.g., less than or equal to about 300 Torr) or vacuum environment without breaking the low pressure or vacuum environment among various processes performed on the substrates in the processing system 100. Accordingly, the processing system 100 may provide for an integrated solution for some processing of substrates.

Examples of a processing system that may be suitably modified in accordance with the teachings provided herein include the Endura®, Producer® or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 1, the factory interface 102 includes a docking station 132 and factory interface robots 134 to facilitate transfer of substrates. The docking station 132 is adapted to accept one or more front opening unified pods (FOUPs) 136. In some examples, each factory interface robot 134 generally includes a blade 138 disposed on one end of the respective factory interface robot 134 adapted to transfer the substrates from the factory interface 102 to the load lock chambers 104, 106.

The load lock chambers 104, 106 have respective ports 140, 142 coupled to the factory interface 102 and respective ports 144, 146 coupled to the transfer chamber 108. The transfer chamber 108 further has respective ports 148, 150 coupled to the holding chambers 116, 118 and respective ports 152, 154 coupled to processing chambers 120, 122. Similarly, the transfer chamber 110 has respective ports 156, 158 coupled to the holding chambers 116, 118 and respective ports 160, 162, 164, 166 coupled to processing chambers 124, 126, 128, 130. The ports 144, 146, 148, 150, 152, 154, 156, 158, 160, 162, 164, 166 can be, for example, slit valve openings with slit valves for passing substrates therethrough by the transfer robots 112, 114 and for providing a seal between respective chambers to prevent a gas from passing between the respective chambers. Generally, any port is open for transferring a substrate therethrough. Otherwise, the port is closed.

The load lock chambers 104, 106, transfer chambers 108, 110, holding chambers 116, 118, and processing chambers 120, 122, 124, 126, 128, 130 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 134 transfers a substrate from a FOUP 136 through a port 140 or 142 to a load lock chamber 104 or 106. The gas and pressure control system then pumps down the load lock chamber 104 or 106. The gas and pressure control system further maintains the transfer chambers 108, 110 and holding chambers 116, 118 with an interior low pressure or vacuum environment (which may include an inert gas). Hence, the pumping down of the load lock chamber 104 or 106 facilitates passing the substrate between, for example, the atmospheric environment of the factory interface 102 and the low pressure or vacuum environment of the transfer chamber 108.

With the substrate in the load lock chamber 104 or 106 that has been pumped down, the transfer robot 112 transfers the substrate from the load lock chamber 104 or 106 into the transfer chamber 108 through the port 144 or 146. The transfer robot 112 is then capable of transferring the substrate to and/or between any of the processing chambers 120, 122 through the respective ports 152, 154 for processing and the holding chambers 116, 118 through the respective ports 148, 150 for holding to await further transfer. Similarly, the transfer robot 114 is capable of accessing the substrate in the holding chamber 116 or 118 through the port 156 or 158 and is capable of transferring the substrate to and/or between any of the processing chambers 124, 126, 128, 130 through the respective ports 160, 162, 164, 166 for processing and the holding chambers 116, 118 through the respective ports 156, 158 for holding to await further transfer. The transfer and holding of the substrate within and among the various chambers can be in the low pressure or vacuum environment provided by the gas and pressure control system.

The processing chambers 120, 122, 124, 126, 128, 130 can be any appropriate chamber for processing a substrate. In some examples, the processing chamber 120 can be capable of performing etch processes, the processing chamber 122 can be capable of performing cleaning processes, the processing chamber 124 can be capable of performing selective removal processes, the processing chamber 126 can be capable of performing chemical vapor deposition (CVD) deposition processes, the processing chamber 128 can be capable of performing respective epitaxial growth processes, and the processing chamber 130 can be capable of performing physical vapor deposition (PVD) processes. The processing chamber 120 may be a Selectra™ Etch chamber available from Applied Materials of Santa Clara, Calif. The processing chamber 122 may be a SiCoNi™ Pre-clean chamber available from Applied Materials of Santa Clara, Calif. The processing chamber 126 may be a WxZ™ chamber available from Applied Materials of Santa Clara, Calif. The processing chamber 128 may be a Centura™ Epi chamber available from Applied Materials of Santa Clara, Calif. The processing chamber 130 may be Volta® CVD/ALD chamber, or EnCoRe® PVD chamber available from Applied Materials of Santa Clara, Calif.

A system controller 168 is coupled to the processing system 100 for controlling the processing system 100 or components thereof. For example, the system controller 168 may control the operation of the processing system 100 using a direct control of the chambers 104, 106, 108, 110, 116, 118, 120, 122, 124, 126, 128, 130 of the processing system 100 or by controlling controllers associated with the chambers 104, 106, 108, 110, 116, 118, 120, 122, 124, 126, 128, 130. In operation, the system controller 168 enables data collection and feedback from the respective chambers to coordinate performance of the processing system 100.

The system controller 168 generally includes a central processing unit (CPU) 170, memory 172, and support circuits 174. The CPU 170 may be one of any form of a general purpose processor that can be used in an industrial setting. The memory 172, or non-transitory computer-readable medium, is accessible by the CPU 170 and may be one or more of memory such as random access memory (RAM), read only memory (ROM), floppy disk, hard disk, or any other form of digital storage, local or remote. The support circuits 174 are coupled to the CPU 170 and may comprise cache, clock circuits, input/output subsystems, power supplies, and the like. The various methods disclosed herein may generally be implemented under the control of the CPU 170 by the CPU 170 executing computer instruction code stored in the memory 172 (or in memory of a particular processing chamber) as, for example, a software routine. When the computer instruction code is executed by the CPU 170, the CPU 170 controls the chambers to perform processes in accordance with the various methods.

FIG. 2 depicts a process flow diagram of a method 200 of forming a semiconductor structure 300, according to one or more embodiments of the present disclosure. FIGS. 3A, 3B, 3C, 3D, 3E, and 3F are cross-sectional views of a portion of the semiconductor structure 300 corresponding to various states of the method 200. It should be understood that FIGS. 3A, 3B, 3C, 3D, 3E, and 3F illustrate only partial schematic views of the semiconductor structure 300, and the semiconductor structure 300 may contain any number of transistor sections and additional materials having aspects as illustrated in the figures. It should also be noted that although the method illustrated in FIG. 2 is described sequentially, other process sequences that include one or more operations that have been omitted and/or added, and/or has been rearranged in another desirable order, fall within the scope of the embodiments of the disclosure provided herein.

Figure 3C:
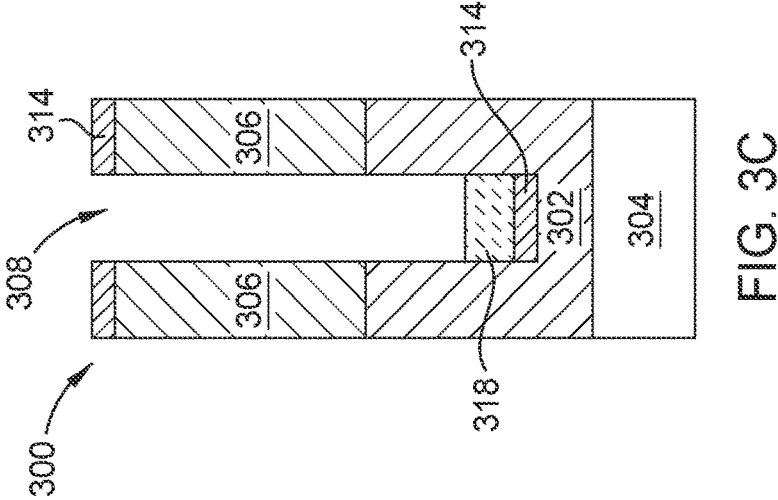
FIGS. 3A, 3B, 3C, 3D, 3E, and 3F are cross-sectional views of a portion of a semiconductor structure corresponding to various states of the method of FIG. 2.
Figure 3B:
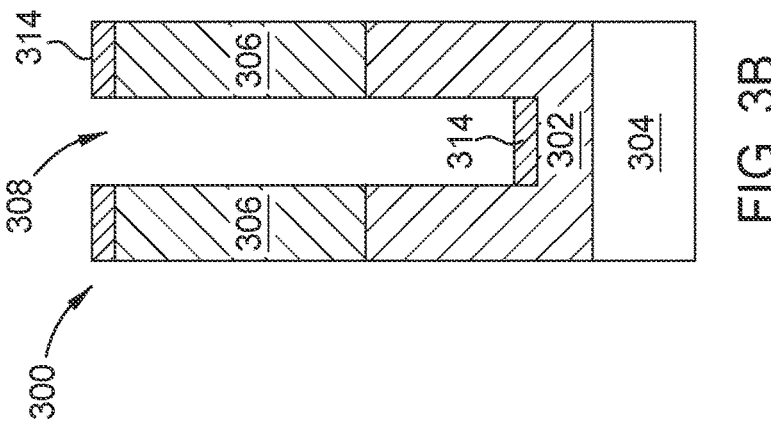
Figure 3A:
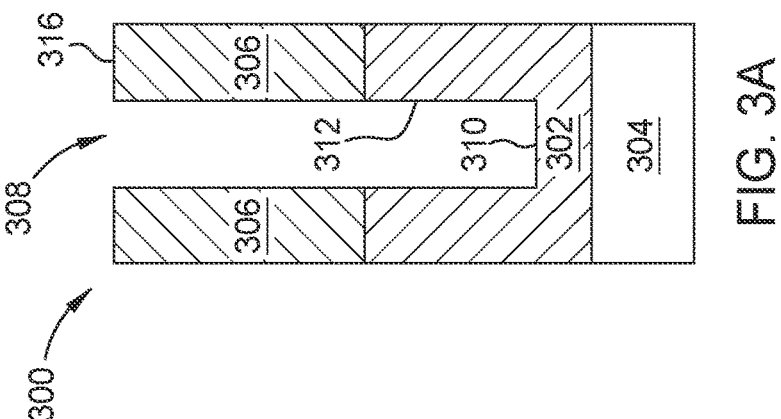

As shown in FIG. 3A, the semiconductor structure 300 includes a first dielectric layer 302 on a substrate 304 and a second dielectric layer 306 formed on the first dielectric layer 302. Features 308, such as trenches and vias (one shown in FIG. 3A) are formed through the second dielectric layer 306 into the first dielectric layer 302. A bottom surface 310 of the feature 308 is a surface of the first dielectric layer 302. Sidewalls 312 of the feature 308 are formed of surfaces of the first dielectric layer 302 and the second dielectric layer 306. The first dielectric layer 302 may be formed of silicon nitride ($Si_3N_4$). The second dielectric layer 306 may be formed of silicon oxide ($SiO_2$). The feature 308 may have a depth of about 60 nm and about 100 nm, and a width of between about 8 nm and about 12 nm.

The term "substrate" as used herein refers to a layer of material that serves as a basis for subsequent processing operations and includes a surface to be cleaned. The substrate 304 may be a silicon based material or any suitable insulating materials or conductive materials as needed. The substrate 304 may include a material such as crystalline silicon (e.g., Si<100> or Si<111>), silicon oxide, strained silicon, silicon germanium, doped or undoped polycrystalline silicon, doped or undoped silicon wafers and patterned or non-patterned wafers, silicon on insulator (SOI), carbon doped silicon oxides, silicon nitride, doped silicon, germanium, gallium arsenide, glass, or sapphire.

The method 200 begins with block 210, in which a metal cap layer deposition process is performed to deposit a metal cap layer 314 on the bottom surface 310 of the feature 308 and on top surfaces 316 of the second dielectric layer 306, as shown in FIG. 3B. The metal cap layer 314 may be formed of tungsten (W), with a thickness of between about 5 nm and about 7 nm.

The metal cap layer deposition process may include physical vapor deposition (PVD), performed in a processing chamber, such as an EnCoRe® PVD chamber available from Applied Materials of Santa Clara, Calif. or the processing chamber 130 shown in FIG. 1.

In block 220, a polymer fill process is performed to partially fill the feature 308 from the bottom surface 310 with a flowable polymer layer 318, as shown in FIG. 3C. The flowable polymer layer 318 acts as a protective layer to protect the underlying metal cap layer 314 in the subsequent metal pullback process in block 230. The flowable polymer layer 318 is contained entirely within the feature 308 and not present on the top surfaces 316 of the second dielectric layer 306. A flowable material is one which, under the proper conditions will flow by gravity to a low point of an exposed surface and/or by capillary action to narrow spaces of trenches or other features. The flowable polymer layer 318 may be formed of polyamine (e.g., C=N double bond containing polymer) with a height from the bottom surface 310 of the feature 308 of about 5 nm and about 30 nm.

The polymer fill process may include a flowable chemical vapor deposition (CVD), performed in a processing chamber, such as the processing chamber 126 shown in FIG. 1.

In the polymer fill process, the semiconductor structure 300 is exposed to precursors, terephthalaldehyde (TPA) and ethylene diamine (EDA), sequentially, with purging in between. Exposure to TPA may allow TPA to be physisorbed on bottom corners of the feature 308. Subsequent exposure to the EDA may convert TPA into polyamine (e.g., C=N double bond containing polymer). This cycle of exposure to TPA and exposure to EDA is repeated until the flowable polymer layer 318 of polyamine with a desired thickness is deposited.

In order to control the flowability of the resulting polymer layer 318, the polymer fill process is performed at a temperature of between about 0° C. and about 400° C.

Figure 3F:
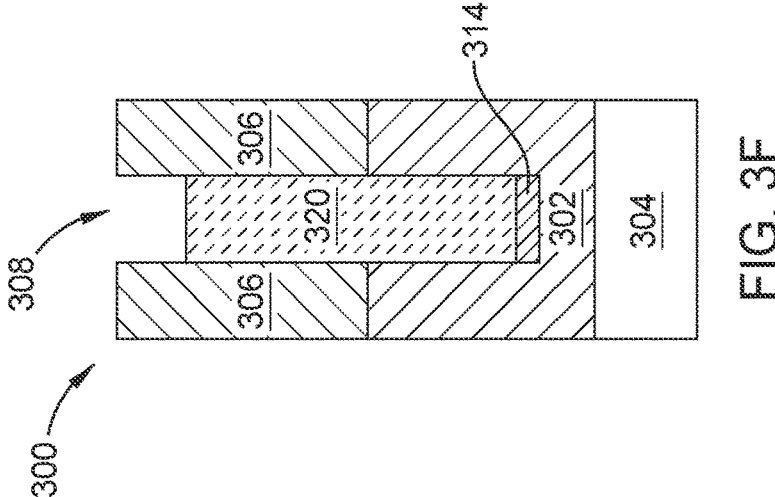
Figure 3E:
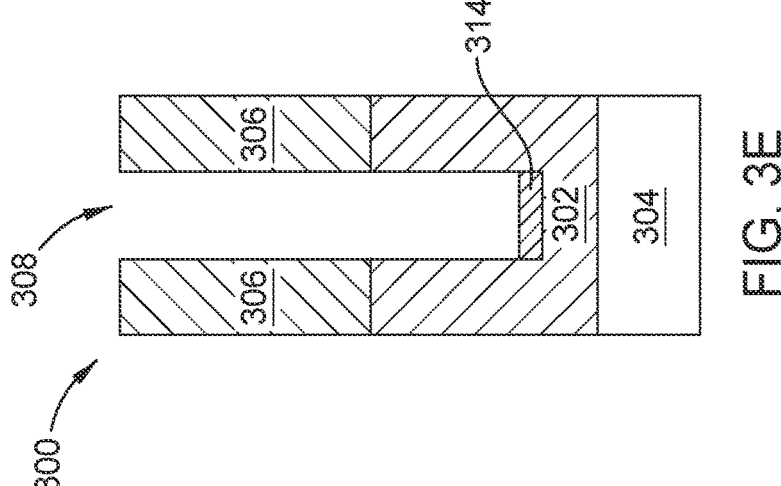
Figure 3D:
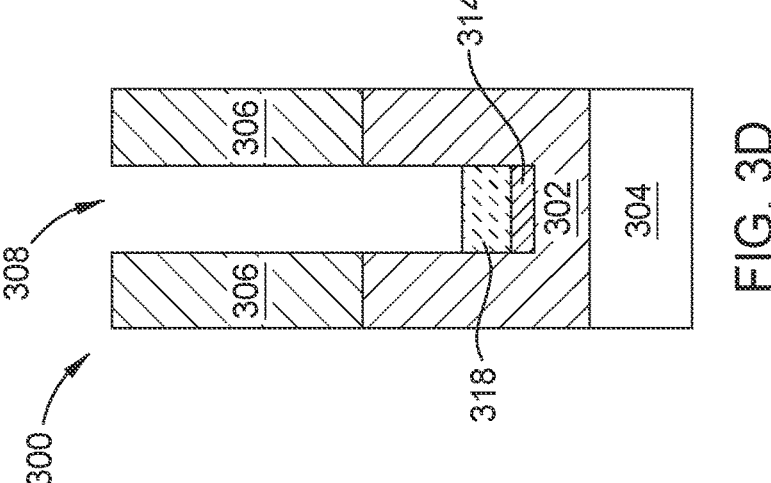

In block 230, a metal pullback process is performed to remove the metal cap layer 314 on the top surfaces 316 of the second dielectric layer 306 selectively to the second dielectric layer 306, as shown in as shown in FIG. 3D. In the metal pullback process, the metal cap layer 314 may be selectively removed without damaging the first dielectric layer 302 (e.g., silicon nitride ($Si_3N_4$)) or the second dielectric layer 306 (e.g., silicon oxide ($SiO_2$)).

The metal pullback process is a two-step etch process including a first etch process and a second etch process.

In a first embodiment, the first etch process is a chemical etch process using molybdenum hexafluoride ($MoF_6$) to remove the metal cap layer 314 (e.g., tungsten (W)) selectively to the first dielectric layer 302 (e.g., silicon nitride ($Si_3N_4$)) or the second dielectric layer 306 (e.g., silicon oxide ($SiO_2$)). The chemical etch process may not damage surfaces of the first dielectric layer 302 or the second dielectric layer 306 unlike a conventional remote plasma assisted dry etch process using nitrogen trifluoride (NF$_3$) in which radicals F* may cause damage on surfaces of the of the first dielectric layer 302 or the second dielectric layer 306. However, the chemical etch process using molybdenum hexafluoride (MoF$_6$) may leave molybdenum (Mo) residues on etched surfaces. Since, in the subsequent metal fill process in block 250, metal material may be undesirably deposited on the molybdenum (Mo) residues on the first dielectric layer 302 or the second dielectric layer 306, the molybdenum (Mo) residues are removed by the second etch process which is a short remote plasma assisted dry etch process using nitrogen trifluoride (NF$_3$) to remove molybdenum (Mo) residues from the first etch process, for a short duration such that surfaces of the of the first dielectric layer 302 or the second dielectric layer 306 are not damaged.

The chemical etch process may be performed at a temperature of between about 250° C. and about 350° C., for example, about 300° C. At this temperature range, the flowable polymer layer 318 may not be damaged. The short remote plasma assisted dry etch process may be performed for between about 0.5 seconds and about 10 seconds.

In a second embodiment, the first etch process is the same as the first etch process in the first embodiment. The second etch process to remove molybdenum (Mo) residues from the first etch process is a dry etch using chlorine (Cl$_2$) plasma. The dry etch process may be performed for between about 1 seconds and about 100 seconds.

In a third embodiment, the first etch process is a dry etch process using chlorine (Cl$_2$) and nitrogen trifluoride (NF$_3$) plasma. Nitrogen trifluoride (NF$_3$) plasma is added to increase an etch rate, but with a small concentration ratio such that surfaces of the first dielectric layer 302 or the second dielectric layer 306 are not damaged. A shortened etch time duration may prevent the flowable polymer layer 318 from deteriorating. The concentration ratio of nitrogen trifluoride (NF$_3$) plasma to chlorine (Cl$_2$) may be between about 1:1 and about 1:10. The second etch process is a dry etch process using chlorine (Cl$_2$) only, such portions of the metal cap layer 314 adjacent to surfaces of the first dielectric layer 302 or the second dielectric layer 306 can be etched without nitrogen trifluoride (NF$_3$) plasma. The first etch process may be performed for between about 1 seconds and about 100 seconds. The second etch process may be performed for between about 50 seconds and about 500 seconds.

The metal pullback process may be performed in a processing chamber, such as a SiCoNi™ Pre-clean chamber available from Applied Materials of Santa Clara, Calif or the processing chamber 122 shown in FIG. 1.

In block 240, a polymer removal and pre-clean process is performed to remove the flowable polymer layer 318 and remove any contaminants or residues of the flowable polymer layer 318 on an exposed surface of the metal cap layer 314, as shown in FIG. 3E.

The polymer removal and pre-clean process may include a first step in which the surface of the metal cap layer 314 is exposed to hydrogen (H$_2$) and oxygen (O$_2$) plasma and a second step in which the surface of the metal cap layer 314 is exposed to hydrogen (H$_2$) only. The first step may be performed at a chamber pressure of between about 1 Torr and about 10 Torr, for example, about 5 Torr at a flow rate of the hydrogen (H$_2$) plasma of between about 1000 sccm and about 10000 sccm, for example, 6000 sccm and a flow rate of the oxygen (O$_2$) between about 100 sccm and about 1000 sccm, for example, 300 sccm. The second step may be performed at a chamber pressure of between about 10 Torr and about 50 Torr, for example, about 20 Torr at a flow rate of the hydrogen (H$_2$).

The polymer removal and pre-clean process may be performed in a processing chamber, such as a Volta® CVD/ALD chamber available from Applied Materials of Santa Clara, Calif. or the processing chamber 130 shown in FIG. 1.

In block 250, a metal fill process is performed to fill the feature 308 with metal fill material 320 such as tungsten (W) from the exposed surface of the metal cap layer 314, as shown in FIG. 3F. This metal fill process is a selective deposition to the exposed surface of the metal cap layer 314 over the first dielectric layer 302 (e.g., silicon nitride (Si$_3$N$_4$)) and the second dielectric layer 306 (e.g., silicon oxide (SiO$_2$)), and thus the feature 308 is filled with the metal fill material 320 in a bottom-up fashion from the bottom surface 310 of the feature 308, without forming any voids or seams within the metal fill material 320.

The metal fill process may include a chemical vapor deposition (CVD) process using a tungsten-containing precursor, such as tungsten hexafluoride (WF$_6$), in a processing chamber, such as the processing chamber 126 shown in FIG. 1.

FIG. 4 depicts a process flow diagram of a method 400 of forming a semiconductor structure 500, according to one or more embodiments of the present disclosure. FIGS. 5A, 5B, 5C, 5D, 5E, 5F, and 5G are cross-sectional views of a portion of the semiconductor structure 500 corresponding to various states of the method 400. It should be understood that FIGS. 5A, 5B, 50, 5D, 5E, 5F, and 5G illustrate only partial schematic views of the semiconductor structure 300, and the semiconductor structure 500 may contain any number of transistor sections and additional materials having aspects as illustrated in the figures. It should also be noted that although the method illustrated in FIG. 4 is described sequentially, other process sequences that include one or more operations that have been omitted and/or added, and/or has been rearranged in another desirable order, fall within the scope of the embodiments of the disclosure provided herein.

Figures 5A, 5B, 5C, 5D:
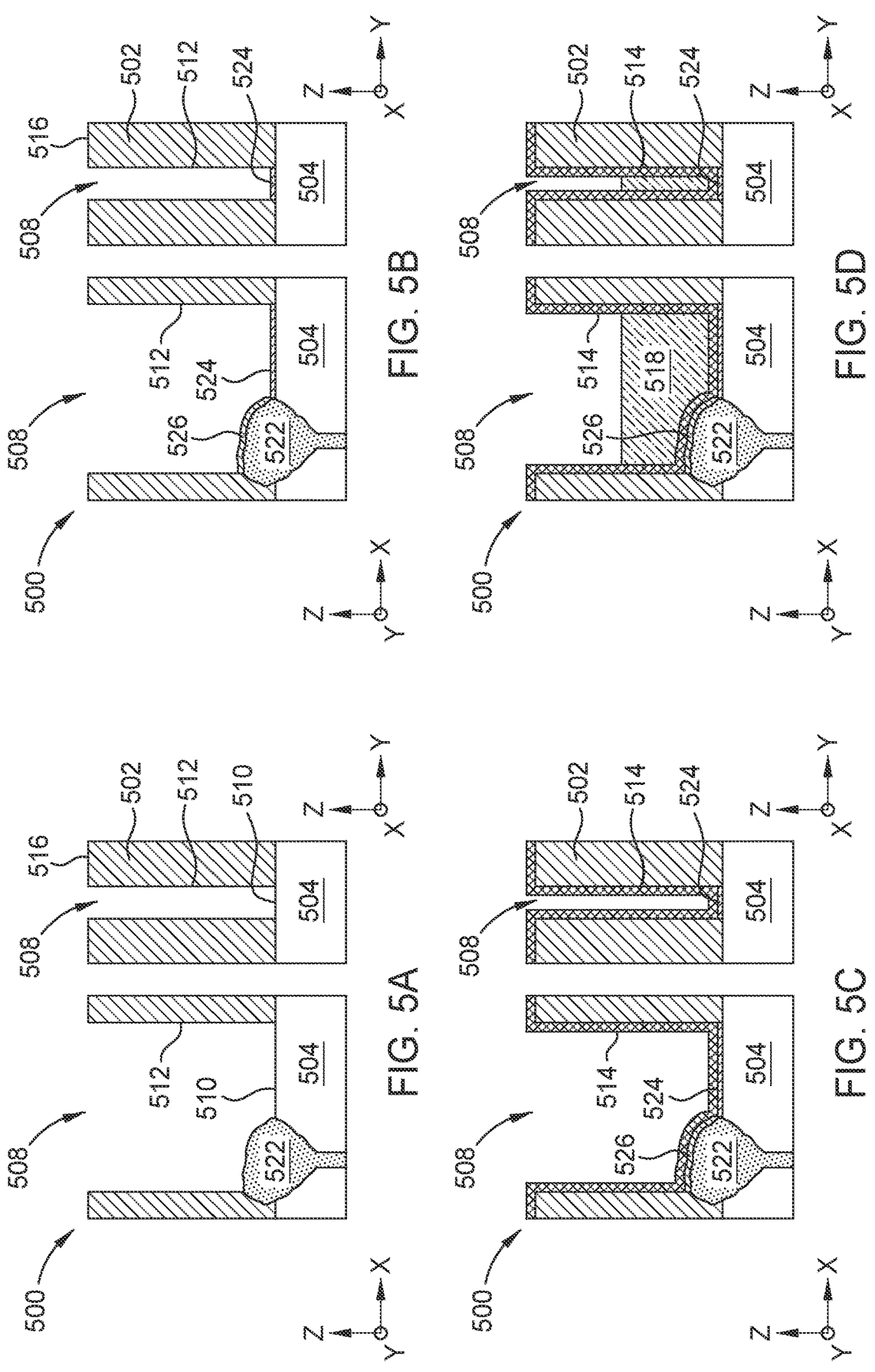
FIGS. 5A, 5B, 5C, 5D, 5E, 5F, and 5G are cross-sectional views of a portion of a semiconductor structure corresponding to various states of the method of FIG. 4.

As shown in FIG. 5A, the semiconductor structure 500 includes a dielectric layer 502 on a substrate 504. A trench 508 is formed through the dielectric layer 502. A bottom surface 510 of the trench 508 is a surface of the substrate 504. A contact 522 may be formed in the substrate 504. The dielectric layer 502 may be formed of silicon nitride (Si$_3$N$_4$) or silicon oxide (SiO$_2$). The trench 508 may each have a depth of about 60 nm and about 100 nm, and a width of between about 8 nm and about 12 nm. The contact 522 may be formed of n-type doped silicon (Si) or p-type doped silicon (Si)).

The method 400 begins with block 410, in which a pre-clean process is performed to pre-clean an exposed surface of the semiconductor structure 500. The pre-clean process may include etching an exposed surface of the semiconductor structure 500 by a wet etch process using a dry etch process, for example, a Tersa™ remote plasma assisted dry etch process, in which the surface of the semiconductor structure 500 is exposed to NH$_3$ and NF$_3$ plasma by-products.

The pre-clean process may be performed in a processing chamber, such as the processing chamber 120 or 122 shown in FIG. 1.

In block 420, a liner layer deposition process is performed to form a liner layer 524 on the bottom surface 510 of the trench 508, as shown in FIG. 5B. An interface layer 526 may be formed over the contact 522. The liner layer 524 may be formed of titanium (Ti), with a thickness of between about 2 nm and about 5 nm. The interface layer 526 may formed of titanium (Ti) silicide with a thickness of between about 2 nm and about 6 nm.

The liner layer deposition process may include plasma-enhanced (PE) CVD deposition, performed in a processing chamber, such as the processing chamber 130 shown in FIG. 1.

In block 430, a metal cap layer deposition process is performed to conformally form a metal cap layer 514 on top surfaces 516 of the dielectric layer 502 and on the bottom surface 510 and the sidewalls 512 of the trench 508, as shown in FIG. 5C. The metal cap layer 514 may be formed of fluorine-free tungsten (FFW), with a thickness of between about 2 nm and about 10 nm.

The metal cap layer deposition process may include a conformal CVD deposition, performed in a processing chamber, such as the processing chamber 126 shown in FIG. 1.

In block 440, a polymer fill process is performed to partially fill the trench 508 from the bottom surface 510 with a flowable polymer layer 518, as shown in FIG. 5D. The flowable polymer layer 518 is contained entirely within the trench 508 and not present on the top surfaces 516 of the dielectric layer 502. The flowable polymer layer 518 be formed of polyamine (e.g., C═N double bond containing polymer) with a height from the bottom surface 510 of the trench 508 of about 5 nm and about 50 nm.

The polymer fill process in block 440 is the same as the polymer fill process in block 220 of FIG. 2.

Figures 5E, 5F, 5G:
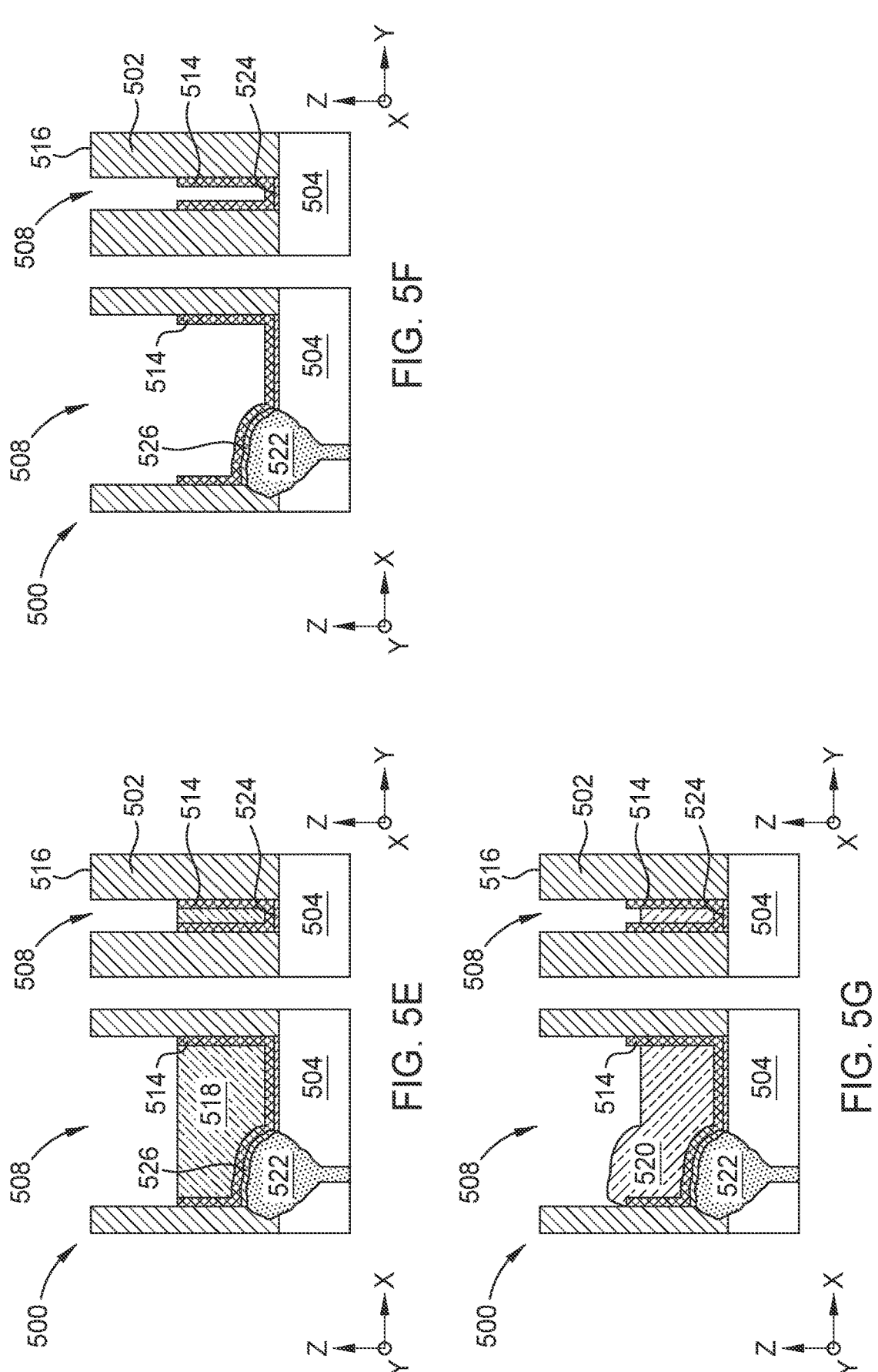

In block 450, a metal pullback process is performed to remove the metal cap layer 514 on the top surfaces 516 of the dielectric layer 502 and on the sidewalls 512 of the trench 508 that are not covered by the flowable polymer layer 518 selectively to the dielectric layer 502, as shown in FIG. 5E. In the metal pullback process, the metal cap layer 514 may be selectively removed without damaging the dielectric layer 502 (e.g., silicon nitride ($Si_3N_4$)) or silicon oxide ($SiO_2$)).

The metal pullback process in block 450 is the same as the metal pullback process in block 230 of FIG. 2.

In block 460, a polymer removal and pre-clean process is performed to remove the flowable polymer layer 518 and remove any contaminants or residues of the flowable polymer layer 518 on an exposed surface of the metal cap layer 514, as shown in FIG. 5F.

The polymer removal and pre-clean process in block 460 is the same as the polymer removal and pre-clean process in block 240 of FIG. 2.

In block 470, a metal fill process is performed to fill the trench 508 with metal fill material 520 such as tungsten (W) from the exposed surface of the metal cap layer 514, as shown in FIG. 5G. This metal fill process is a selective deposition to the exposed surface of the metal cap layer 514 over the dielectric layer 502 (e.g., silicon nitride ($Si_3N_4$) or silicon oxide ($SiO_2$)), and thus the trench 508 is filled with the metal fill material 520 in a bottom-up fashion from the bottom surface 510 of the trench 508, without forming any voids or seams within the metal fill material 520.

The metal fill process in block 470 is the same as the metal fill process in block 250 of FIG. 2.

The embodiments described herein provide methods for filling a feature having a small critical dimension (CD) with void-free metal, such as tungsten (W). The methods described herein include a deposition of a polymer layer as a protective layer for an underlying tungsten cap layer, a tungsten pullback that selectively removes a tungsten cap layer from a dielectric layer (e.g., silicon nitride ($Si_3N_4$)), and selective metal deposition on the remaining tungsten cap layer. The use of a polymer layer provides capability of metal fill in a feature of a small CD. The tungsten pullback according to the embodiments selectively removes tungsten over a dielectric layer (e.g., silicon nitride ($Si_3N_4$)) without damaging the dielectric layer.

While the foregoing is directed to embodiments of the present disclosure, other and further embodiments of the disclosure may be devised without departing from the basic scope thereof, and the scope thereof is determined by the claims that follow.

The invention claimed is:

1. A method of filling a feature in a semiconductor structure with metal, comprising:

performing a metal cap layer deposition process to deposit a metal cap layer on a bottom surface of a feature formed within a dielectric layer and top surfaces of the dielectric layer;

performing a polymer fill process to partially fill the feature from the bottom surface with a flowable polymer layer;

performing a metal pullback process to remove the metal cap layer on the top surfaces of the dielectric layer selectively to the dielectric layer, wherein the metal pullback process comprises:

a first etch process comprising a chemical etch process using molybdenum hexafluoride ($MoF_6$) to remove the metal cap layer selectively to the dielectric layer; and a second etch process to remove residues on etched surfaces of the dielectric layer from the first etch process;

performing a polymer removal and pre-clean process to remove the flowable polymer layer and pre-clean a surface of the metal cap layer; and performing a metal fill process to fill the feature from the surface of the metal cap layer with metal fill material.

2. The method of claim 1, wherein the second etch process comprises a remote plasma assisted dry etch process using nitrogen trifluoride ($NF_3$).

3. The method of claim 2, wherein the remote plasma assisted dry etch process using nitrogen trifluoride ($NF_3$) is performed for between 0.5 seconds and 10 seconds.

4. The method of claim 1, wherein the second etch process comprises a dry etch using chlorine ($Cl_2$) plasma.

5. The method of claim 1, wherein the metal cap layer comprises tungsten (W).

6. The method of claim 1, wherein the dielectric layer comprises silicon nitride ($Si_3N_4$).

7. The method of claim 1, where the flowable polymer layer comprises polyamine.

8. The method of claim 1, wherein the polymer removal and pre-clean process comprises:

exposing the surface of the metal cap layer to hydrogen ($H_2$) and oxygen ($O_2$) plasma; and exposing the surface of the metal cap layer to oxygen ($O_2$) plasma only.

9. A method of filling a trench in a semiconductor structure with metal, comprising:

performing a liner layer deposition process to form a liner layer on a bottom surface of a trench formed within a dielectric layer and top surfaces of the dielectric layer;

performing a metal cap layer deposition process to deposit a metal cap layer on the bottom surface and sidewalls of the trench;

performing a polymer fill process to partially fill the trench from the bottom surface with a flowable polymer layer;

performing a metal pullback process to remove the metal cap layer on the sidewalls of the trench that are not covered by the flowable polymer layer selectively to the dielectric layer, wherein the metal pullback process comprises:

a first etch process comprising a chemical etch process using molybdenum hexafluoride ($MoF_6$) to remove the metal cap layer selectively to the dielectric layer; and a second etch process comprising a remote plasma assisted dry etch process using nitrogen trifluoride ($NF_3$);

performing a polymer removal and pre-clean process to remove the flowable polymer layer and pre-clean a surface of the metal cap layer; and performing a metal fill process to fill the trench from the surface of the metal cap layer with metal fill material.

10. The method of claim 9, wherein:

the polymer removal process comprises exposing the surface of the metal cap layer to hydrogen ($H_2$) and oxygen ($O_2$) plasma; and the pre-clean process comprises exposing the surface of the metal cap layer to oxygen ($O_2$) plasma only.

11. A method of filling a trench in a semiconductor structure with metal, comprising:

performing a liner layer deposition process to form a liner layer on a bottom surface of a trench formed within a dielectric layer and top surfaces of the dielectric layer;

performing a metal cap layer deposition process to deposit a metal cap layer on the bottom surface and sidewalls of the trench;

performing a polymer fill process to partially fill the trench from the bottom surface with a flowable polymer layer;

performing a metal pullback process to remove the metal cap layer on the sidewalls of the trench that are not covered by the flowable polymer layer selectively to the dielectric layer;

performing a polymer removal and pre-clean process to remove the flowable polymer layer and pre-clean a surface of the metal cap layer; and performing a metal fill process to fill the trench from the surface of the metal cap layer with metal fill material, wherein the liner layer comprises titanium (Ti), the metal cap layer comprises tungsten (W), the dielectric layer comprises silicon nitride ($Si_3N_4$), and the flowable polymer layer comprises polyamine.

* * * * *